(12) United States Patent
Hu et al.

(10) Patent No.: US 10,739,930 B2
(45) Date of Patent: Aug. 11, 2020

(54) MASK PLATE, DISPLAY SUBSTRATE, METHOD FOR MANUFACTURING DISPLAY SUBSTRATE, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Haifeng Hu, Beijing (CN); Ming Zhang, Beijing (CN); Xianlin Ding, Beijing (CN); Weijie Ma, Beijing (CN); Huan Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 16/134,521

(22) Filed: Sep. 18, 2018

(65) Prior Publication Data

US 2019/0235669 A1 Aug. 1, 2019

(30) Foreign Application Priority Data

Jan. 31, 2018 (CN) .......................... 2018 1 0097795

(51) Int. Cl.
*G06F 3/047* (2006.01)
*G06F 3/041* (2006.01)
(Continued)

(52) U.S. Cl.
CPC ............ *G06F 3/047* (2013.01); *G03F 7/2002* (2013.01); *G06F 3/044* (2013.01); *G06F 3/0412* (2013.01);
(Continued)

(58) Field of Classification Search
CPC ... G06F 7/20; G06F 7/40; G06F 3/044; G06F 3/042; G06F 17/50; G09G 3/36;
(Continued)

(56) References Cited

U.S. PATENT DOCUMENTS 6,258,489 B1 7/2001 Stanton et al.
6,566,017 B1 5/2003 Chen et al.
(Continued)

FOREIGN PATENT DOCUMENTS

| CN | 104977813 A | 10/2015 |
|---|---|---|
| WO | 2017114725 A1 | 7/2017 |

OTHER PUBLICATIONS

Office Action, including Search Report, for Chinese Patent Application No. 201810097795.0, dated Feb. 14, 2020, 21 pages.

*Primary Examiner* — William Lu
(74) *Attorney, Agent, or Firm* — Westman, Champlin & Koehler, P.A.

(57) ABSTRACT

A method for manufacturing a display substrate includes: providing a substrate; forming a film layer and a photoresist layer to be patterned on the substrate; exposing and developing the photoresist layer to form a photoresist pattern including a first photoresist pattern and a second photoresist pattern, the first photoresist pattern corresponding to a film layer pattern to be formed, and the second photoresist pattern being located on at least two opposite sides of the first photoresist pattern, and spaced apart from the first photoresist pattern; wet-etching the film layer to be patterned so that a film layer between the first photoresist pattern and the second photoresist pattern is etched, a film layer under the second photoresist pattern being detached from the substrate, and a film layer under the first photoresist pattern forming the film layer pattern.

13 Claims, 4 Drawing Sheets

(51) Int. Cl.
*G06F 3/044* (2006.01)
*H01L 21/027* (2006.01)
*G03F 7/20* (2006.01)

(52) U.S. Cl.
CPC ...... *G06F 3/04164* (2019.05); *H01L 21/0273* (2013.01); *G06F 2203/04103* (2013.01)

(58) Field of Classification Search
CPC ..... H01L 31/0232; H01L 31/18; H01L 21/66; H01L 21/76; H01L 21/0338; H01L 21/0335; H01L 21/0337
See application file for complete search history.

(56) References Cited

U.S. PATENT DOCUMENTS

| | | | |
|---|---|---|---|
| 6,807,662 B2 * | 10/2004 | Toublan | G03F 1/70 430/13 |
| 8,767,167 B2 * | 7/2014 | Lim | G06F 3/041 178/18.01 |
| 9,324,570 B1 * | 4/2016 | Liou | H01L 21/0337 |
| 9,577,142 B2 * | 2/2017 | Ishiura | H01S 5/1209 |
| 10,627,722 B2 | 4/2020 | Tel et al. | |
| 2003/0021466 A1 * | 1/2003 | Adel | G03F 7/70633 382/151 |
| 2004/0032390 A1 * | 2/2004 | Liang | G02F 1/167 345/107 |
| 2004/0233402 A1 * | 11/2004 | Smith | G03B 27/68 355/52 |
| 2006/0094244 A1 * | 5/2006 | Yamada | H01L 21/0237 438/700 |
| 2007/0065990 A1 * | 3/2007 | Degroote | H01L 21/0337 438/142 |
| 2007/0128401 A1 * | 6/2007 | Kuo | H01L 27/3283 428/57 |
| 2008/0206898 A1 * | 8/2008 | Fukuhara | H01L 22/12 438/7 |
| 2010/0117081 A1 * | 5/2010 | Obuchi | G01R 31/318511 257/48 |
| 2010/0143848 A1 * | 6/2010 | Jain | B81C 1/0019 430/315 |
| 2011/0018079 A1 * | 1/2011 | Pain | H01L 27/1463 257/432 |
| 2011/0236597 A1 * | 9/2011 | Chan | G06F 3/044 427/555 |
| 2012/0038595 A1 * | 2/2012 | Park | G06F 3/044 345/176 |
| 2014/0011316 A1 * | 1/2014 | Park | H01L 27/14636 438/70 |
| 2014/0248565 A1 * | 9/2014 | Defranco | G03F 7/0046 430/325 |
| 2014/0322656 A1 * | 10/2014 | Wright | G03F 7/038 430/325 |
| 2016/0034064 A1 * | 2/2016 | Ding | G06F 3/044 345/174 |
| 2016/0203983 A1 * | 7/2016 | Kim | H01L 21/0337 438/695 |
| 2016/0372702 A1 * | 12/2016 | Xu | H01L 27/3246 |
| 2017/0023840 A1 * | 1/2017 | Chen | G02F 1/136227 |
| 2018/0252954 A1 * | 9/2018 | Liu | G02F 1/13338 |
| 2019/0018313 A1 | 1/2019 | Tel et al. | |

* cited by examiner

MASK PLATE, DISPLAY SUBSTRATE, METHOD FOR MANUFACTURING DISPLAY SUBSTRATE, AND DISPLAY DEVICE

CROSS-REFERENCE TO RELATED APPLICATION

The present application claims a priority of the Chinese patent application No. 201810097795.0 filed on Jan. 31, 2018, which is incorporated herein by reference in its entirety.

TECHNICAL FIELD

The present disclosure relates to the field of display technology, in particular to a mask plate, a display substrate, a method for manufacturing the same and a display device.

BACKGROUND

Display products have been applied in many fields of human activities, and the quality of display products depends on the level of process during manufacturing. When manufacturing an existing display product, patterns of some film layers, such as a metal pattern and a metal oxide pattern are to be formed by a wet etching process.

SUMMARY

In one aspect, the present disclosure provides in some embodiments a mask plate, used for forming a film layer pattern on a display substrate, the mask plate comprises at least one group of mask patterns, each group of mask patterns includes: a first pattern, corresponding to the film layer pattern; and a second pattern, located on at least two opposite sides of the first pattern; wherein the second pattern and the first pattern are alternately arranged, a line width of the second pattern along an extending direction of the second pattern is equal to a line width of the first pattern along the extending direction of the second pattern, and the line width of the second pattern along a direction perpendicular to extending direction of the second pattern is within a threshold range.

In some embodiments, the threshold range is 5%-10% of the line width of the first pattern along the extending direction of the second pattern.

In some embodiments, spacing between the first pattern and the second pattern is 5%-10% of a line width of the first pattern along a direction perpendicular to the extending direction of the second pattern.

In some embodiments, the first pattern and the second pattern are both light transmitting patterns, or both opaque patterns.

In some embodiments, the second pattern is located around the first pattern.

In some embodiments, the second pattern is a rectangle or long elliptical shape.

In another aspect, a method for manufacturing a display substrate, includes: providing a substrate; forming a film layer and a photoresist layer to be patterned on the substrate; exposing and developing the photoresist layer by using the above mask plate, to form at least one group of photoresist patterns, each group of photoresist pattern including a first photoresist pattern and a second photoresist pattern, the first photoresist pattern corresponding to a film layer pattern to be formed, and the second photoresist pattern being located on at least two opposite sides of the first photoresist pattern, and spaced apart from the first photoresist pattern, a line width of the second photoresist pattern in the extending direction of the second photoresist pattern being equal to or greater than a line width of the first photoresist pattern in the extending direction of the second photoresist pattern, and a line width of the second photoresist pattern in a direction perpendicular to the extending direction of the second photoresist pattern is within a threshold range; and wet-etching the film layer to be patterned so that a film layer between the first photoresist pattern and the second photoresist pattern is etched, a film layer under the second photoresist pattern being detached from the substrate, and a film layer under the first photoresist pattern forming the film layer pattern.

In some embodiments, the threshold range is 5%-10% of the line width of the first pattern along the extending direction of the second pattern.

In some embodiments, spacing between the first pattern and the second pattern is 5%-10% of a line width of the first pattern along a direction perpendicular to the extending direction of the second pattern.

In some embodiments, the film layer is made of a metal or a metal oxide.

In some embodiments, the film layer pattern is metal lines.

In some embodiments, the film layer pattern is metal lines in a non-display area.

In some embodiments, the display substrate is a touch display substrate, and the film layer pattern is touch electrode lines in the non-display area.

In some embodiments, the first pattern and the second pattern are both light transmitting patterns, or both opaque patterns.

In some embodiments, the second pattern is a rectangle or long elliptical shape.

In another aspect, a display substrate, manufactured by using the above method, the display substrate includes: a substrate, and a film layer pattern disposed on the substrate, a vertical cross section of the film layer pattern having a positive trapezoid shape.

In some embodiments, the film layer pattern is metal lines in a non-display area.

In some embodiments, the display substrate is a touch display substrate, and the film layer pattern is touch electrode lines in a non-display area.

In another aspect, a display device includes the above display substrate.

In another aspect, a method for manufacturing a display substrate includes: cleaning a substrate, forming a touch driving electrode, a touch sensing electrode and an intermediate insulating layer respectively on the substrate; plating or coating the substrate with a metal layer or other conductive material layer; coating the substrate with a layer of photoresist, exposing and developing to obtain a plurality of groups of photoresist patterns, each group of photoresist patterns including a first photoresist pattern and a second a photoresist pattern, the first photoresist pattern corresponding to a touch electrode line to be formed, and the second photoresist pattern being located on two opposite sides of the first photoresist pattern, and spaced apart from the first photoresist pattern, a line width of the second photoresist pattern in an extending direction of the second photoresist pattern being equal to or greater than a line width of the first photoresist pattern in the extending direction of the second photoresist pattern, and a line width of the second photoresist pattern in a direction perpendicular to the extending direction of the second photoresist pattern is less than a threshold; placing the substrate in an etching solution, and obtaining a photoresist/metal composite film layer pattern having a positive trapezoid shape; stripping remaining photoresists to obtain a touch electrode line having a cross section of a positive trapezoidal shape; and connecting the touch electrode line to a flexible printed circuit board and an integrated circuit through an anisotropic conductive film.

BRIEF DESCRIPTION OF THE DRAWINGS

In order to more clearly illustrate the technical solutions of the embodiments of the present disclosure, the drawings to be used in the embodiments of the present disclosure will be briefly described below. It is obvious that the following drawings are only some embodiments of the present disclosure. Based on these drawings, other drawings may also be obtained by a person skilled in the art without creative work.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the described embodiments are only a part of embodiments of the present disclosure, not all embodiments. Based on the described embodiments, all embodiments obtained by a person skilled in the art are within the scope of the present disclosure.

Figure 1:
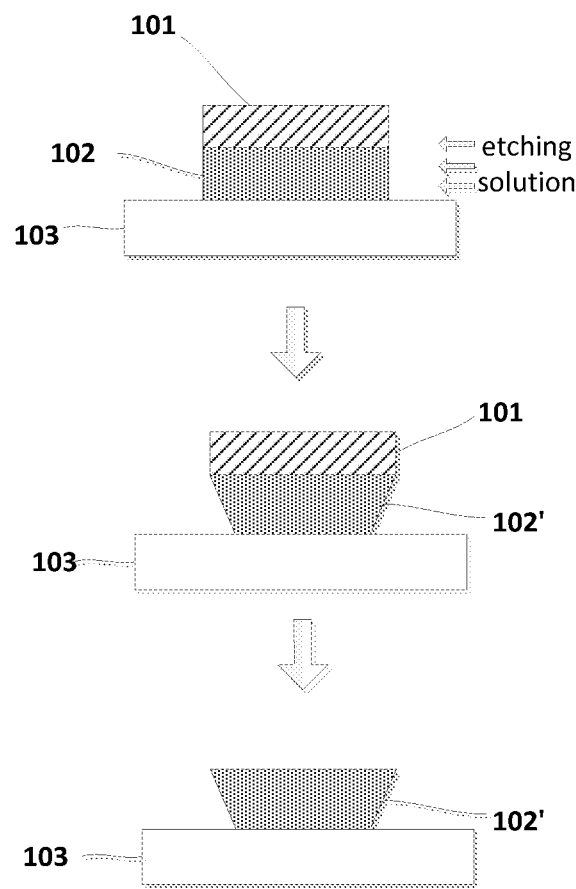
FIG. 1 is a schematic diagram showing a method for manufacturing a film layer pattern on the display substrate in the related art.

Referring to FIG. 1, a film layer 102 and a photoresist pattern 101 are formed on a substrate 103, and etching is performed using a wet etching process to obtain a film layer pattern 102'. A problem of undercut exists in the film layer pattern 102', so that the contact area between the film layer pattern 102' and the substrate 103 becomes small, which affects the adhesion of the film layer pattern.

Figure 2:
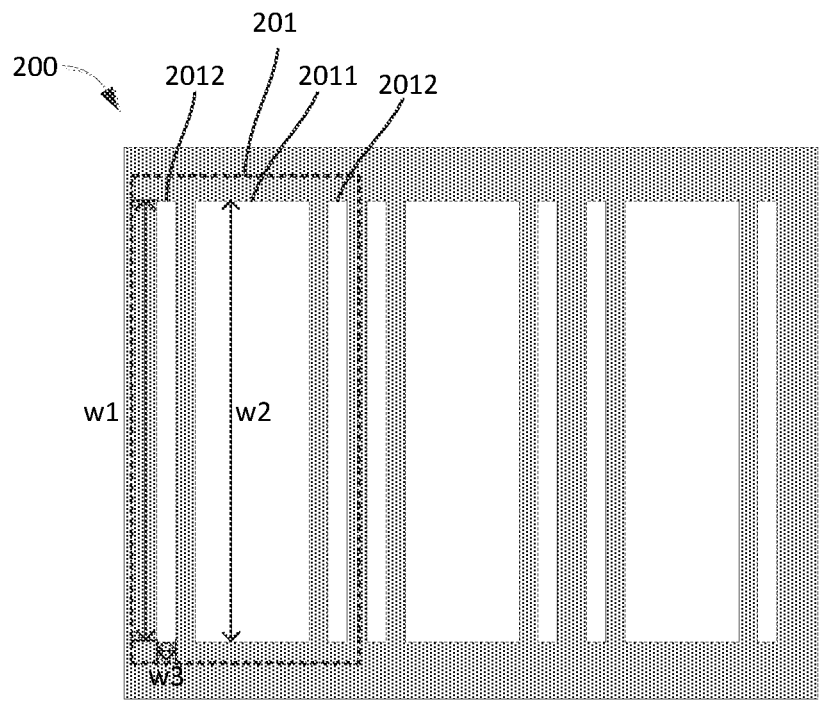
FIG. 2 is a structural schematic diagram showing a mask plate according to some embodiments of the present disclosure.

FIG. 2 shows a mask plate, used for forming film layer patterns on a display substrate. The make plate 200 includes at least one group of mask patterns 201, each group of the mask patterns includes: a first pattern 2011 corresponding to the film layer pattern, and a second pattern 2012 located on both sides of the first pattern 2011, the second pattern 2012 and the first pattern 2011 being alternately arranged. The line width w1 of the second pattern 2012 along the extending direction thereof is equal to the line width w2 of the first pattern 2011 along the same direction (ie, the extending direction of the second pattern 2012), and the line width w3 of the second pattern 2012 along the direction perpendicular to its extending direction is within a threshold range, and the first pattern 2011 and the second pattern 2012 are both light transmitting patterns.

The mask plate provided by the embodiment of the present disclosure is used for patterning a photoresist layer when forming a film layer pattern on a display substrate, so that the formed photoresist layer includes a first photoresist pattern corresponding to the film layer pattern and a second photoresist pattern on both sides of the first photoresist pattern. In the wet etching process, a film layer under the second photoresist pattern can protect a film layer under the first photoresist pattern, so as to prevent the etching solution from over-etching the film layer under the first photoresist pattern, thereby avoiding the undercut problem of the finally formed film pattern, so that the vertical section of the formed film pattern is a positive trapezoid. As compared with the film layer patterns after wet etching in prior art, the contact area with the substrate is larger, which improves the adhesion of the film pattern and makes the difference between the lithography critical dimension (DICD) and the etch critical dimension (FIDC) of the film pattern smaller, to ensure product accuracy and improve product yield.

In the above embodiment, each group of mask patterns 201 includes: a first pattern 2011 corresponding to the film layer pattern, and two second patterns 2012 located on two opposite sides of the first pattern 2011, so that the formed photoresist layer includes a first photoresist pattern corresponding to the film layer pattern, and two second photoresist patterns on both sides of the first photoresist pattern. During the wet etching process, the film layer under the second photoresist pattern can protect the film layer under the first photoresist pattern, so as to prevent the etching solution from over-etching the film layer under the first photoresist pattern.

Figure 3:
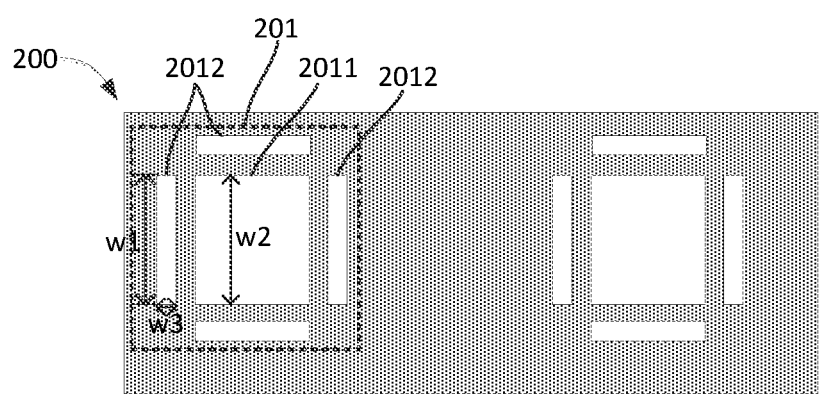
FIG. 3 is a structural schematic diagram showing a mask plate according to some embodiments of the present disclosure.

Referring to FIG. 3, in some embodiments of the present disclosure, each group of mask patterns 201 may include: a first pattern 2011 corresponding to the film layer pattern, and four second patterns 2012 located around the first pattern 2011, so that the formed photoresist layer includes a first photoresist pattern corresponding to the film layer pattern, and four second photoresist patterns located around the first photoresist pattern. During the wet etching process, the film layer under the second photoresist pattern can protect the film layer under the first photoresist pattern, so as to prevent the etching solution from over-etching the film layer under the first photoresist pattern.

In the above embodiment, the first pattern 2011 and the second pattern 2012 are both light transmitting patterns. At this time, a negative photoresist is used in an exposure process, that is, the negative photoresist in the exposed region is cured. The negative photoresist in the unexposed areas is removed during the development process.

In some embodiments of the present disclosure, the first pattern 2011 and the second pattern 2012 are both opaque patterns. In this case, a positive photoresist is used in the exposure process, that is, the positive photoresist in an unexposed region is cured and the positive photoresist in the exposed areas is removed during the development process.

In the above embodiments, the second pattern 2012 is an elongated (i.e., rectangle) pattern and an extension direction of the second pattern is a length direction of the rectangle. In some other embodiments of the present disclosure, the second pattern 2012 may be a long elliptical shape or the like. When the second pattern 2012 is a long elliptical shape, the line width in the extending direction is equal to the width of the long axis of the long ellipse, and the line width in the direction perpendicular to the extending direction is equal to the width of the short axis of the long ellipse.

In the above embodiment, the line width of the second pattern 2012 in the extending direction is equal to the line width of the first pattern 2011 in the same direction. In some other embodiments of the present disclosure, the line width of the second pattern 2012 in its extending direction may also be greater than the line width of the first pattern 2011 in the same direction.

In some embodiments of the present disclosure, the line width of the second pattern 2012 in a direction perpendicular to its extending direction is equal to 5% to 10% of the line width of the first pattern 2011 in the same direction. With this line width, the film layer under the second photoresist pattern may not be etched away in advance during the wet etching process, so as to protect the film layer under the first photoresist pattern during the wet etching process. When the required film layer is etched, it is just detachable from the substrate of the display substrate.

In some embodiments of the present disclosure, the spacing between the second pattern 2012 and the first pattern 2011 is equal to 5% to 10% of the line width of the first pattern 2011 in a direction perpendicular to the extending direction of the second pattern 2012. With this wide spacing, it is ensured that the film layer under the first photoresist pattern is not over-etched during the wet etching process.

Figure 4:
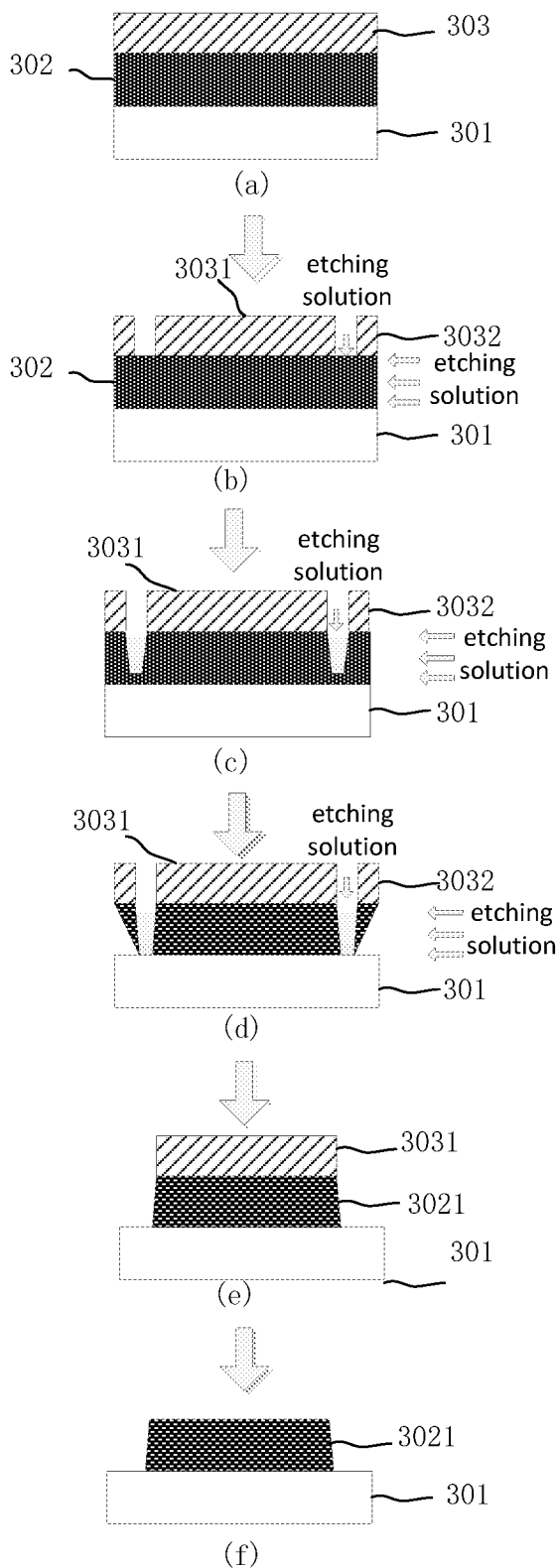
FIG. 4 is a schematic diagram showing a method for manufacturing a display substrate according to some embodiments of the present disclosure.
Figure 5:
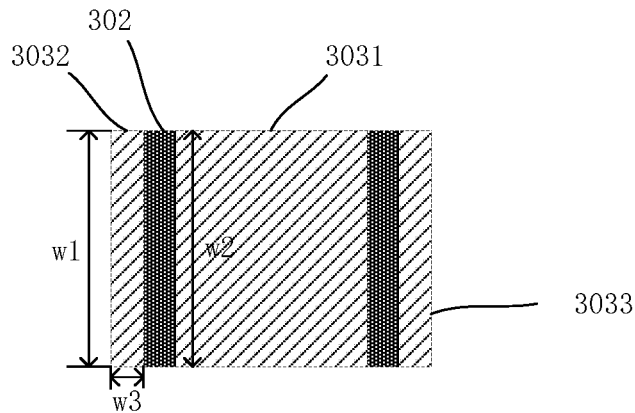
FIG. 5 is a schematic diagram showing a photoresist pattern formed by the method of FIG. 4 according to some embodiments of the present disclosure.

Referring to FIGS. 4 and 5, some embodiments of the present disclosure provides a method for manufacturing a display substrate. The method includes the following steps.

Step 11: providing a substrate 301;

Step 12: referring to (a) in FIG. 4, forming a film layer 302 and a photoresist layer 303 to be patterned on the substrate 301;

Step 13: referring to (b) in FIG. 4, the photoresist layer 303 is exposed and developed by using a mask plate to form at least one group of photoresist patterns, each group of photoresist pattern includes a first photoresist pattern 3031 and a second photoresist pattern 3032, the first photoresist pattern 3031 corresponds to a film layer pattern to be formed, and the second photoresist pattern 3032 is located on opposite sides of the first photoresist pattern 3031, spaced apart from the first photoresist pattern 3031, the line width w1 of the second photoresist pattern 3032 in the extending direction thereof is equal to or greater than the line width w2 of the first photoresist pattern 3031 in the same direction, and the line width w3 of the second photoresist pattern 3032 in a direction perpendicular to the extending direction thereof is within a threshold range. The preset threshold is set to ensure that the film layer 302 under the second photoresist pattern 3032 can be detached from the substrate 301 during the wet etching process.

Step 14: referring to (b)-(e) in FIG. 4, the film layer 302 to be patterned is wet-etched so that a film layer between the first photoresist pattern 3031 and the second photoresist pattern 3032 is etched, the film layer under the second photoresist pattern 3032 is detached from the substrate 301, and the film layer under the first photoresist pattern 3031 forms the film layer pattern 3021.

Step 15: referring to (f) in FIG. 4, the remaining photoresist is peeled off.

In some embodiments of the present disclosure, it is possible that step 15 is not performed after step 14 is completed, that is, the remaining photoresist is not peeled off. In the subsequent process, the remaining photoresist is used as a protection layer to protect film layer pattern.

In some embodiments of the present disclosure, during the process of forming the film layer pattern, the photoresist layer is patterned so that the formed photoresist layer includes a first photoresist pattern corresponding to the film layer pattern, and a second photoresist pattern on both sides of the first photoresist pattern. During the wet etching process, the film layer under the second photoresist pattern can protect the film layer under the first photoresist pattern, so as to prevent etching solution from over-etching the film layer under the first photoresist pattern, and avoid the undercut problem of the finally formed film pattern, so that the vertical cross-section of the formed film pattern is a positive trapezoid. As compared with the film layer after wet etching in the prior art, the contact area with the substrate is larger, the adhesion of the film pattern is improved, and the difference between the DICD and the FIDC of the film pattern is smaller, the product accuracy is ensured, and the product yield is improved.

In the above embodiment, each group of photoresist patterns includes: a first photoresist pattern 3031 corresponding to the film layer pattern, and two second photoresist patterns 3032 on two opposite sides of the first photoresist pattern 3031. During the wet etching process, the film layer under the second photoresist pattern 3032 can protect the film layer under the first photoresist pattern 3031 to prevent the etching solution from over etching the film layer under the first photoresist pattern 3031.

In some other embodiments of the present disclosure, each group of photoresist patterns may further include: a first photoresist pattern corresponding to the film layer pattern and four second patterns located around the first photoresist pattern. During the wet etching process, the film layer under the second photoresist pattern can protect the film layer under the first photoresist pattern, so as to prevent the etching solution from over-etching the film layer under the first photoresist pattern.

In the above embodiments, the second photoresist pattern 3032 is an elongated (i.e., rectangle) pattern. In some other embodiments of the present disclosure, the second photoresist pattern 3032 may be a long elliptical shape or the like. When the second photoresist pattern 3032 is a long elliptical shape, the line width in the extending direction is equal to the width of the long axis of the long ellipse, and the line width in the direction perpendicular to the extending direction is equal to the width of the short axis of the long ellipse.

In some embodiments, the line width of the second photoresist pattern 3032 in the extending direction is equal to the line width of the first photoresist pattern 3031 in the same direction. In some other embodiments of the present disclosure, the line width of the second photoresist pattern 3032 in its extending direction may also be greater than the line width of the first photoresist pattern 3031 in the same direction.

In some embodiments of the present disclosure, the line width of the second photoresist pattern 3032 in a direction perpendicular to its extending direction is equal to 5% to 10% of the line width of the first photoresist pattern 3031 in the same direction. With this line width, the film layer under the second photoresist pattern 3032 may not be etched away in advance during the wet etching process, so as to protect the film layer under the first photoresist pattern 3031 during the wet etching process. When the required film layer is etched, it is just detachable from the substrate 301.

In some embodiments of the present disclosure, the spacing between the second photoresist pattern 3032 and the first photoresist pattern 3031 is equal to 5% to 10% of the line width of the first photoresist pattern 3031 in a direction perpendicular to the extending direction of the second photoresist pattern 3032. With this wide spacing, it is ensured that the film layer under the first photoresist pattern is not over-etched during the wet etching process.

In some embodiments of the present disclosure, the film layer is formed using a metal or a metal oxide. The patterning process of the metal and the metal oxide is usually performed by a wet etching process, and the undercut problem of the formed film layer is apt to occur. When the metal or metal oxide film layer pattern is formed by the method for manufacturing the display substrate in the embodiments of the present disclosure, the undercut problem may be avoided. Of course, the film layer may also be made of other materials.

In the embodiment of the present disclosure, the film layer pattern may be metal lines, for example, a gate line, a data line, or a touch electrode line in a display area; or a gate line, a data line or a touch electrode line in a non-display area. The metal lines generally have a narrow line width. If the undercut occurs, the adhesion is reduced, and it is easily detached from the display substrate. When the metal lines are formed by the method for manufacturing the display substrate in the embodiments of the present disclosure, the undercut of the metal lines can be avoided. The yield and performance of the display substrate are improved.

In some embodiments of the present disclosure, the film layer pattern may be metal lines in a non-display area, especially for a narrow frame display product, and the metal lines in the non-display area generally have a narrow line width. If undercut occurs, the adhesion is reduced, and it is apt to detach off from the display substrate. When the metal lines in the non-display area is produced by the method for manufacturing the display substrate of the embodiment of the present disclosure, the problem of the undercut of the formed metal lines can be avoided, and the yield and the performance of the display substrate can be improved. Optionally, the display substrate is a touch display substrate, and the film layer pattern is a touch electrode line in a non-display area.

The method for manufacturing the display substrate in some embodiments of the present disclosure is described by taking the above-mentioned film layer pattern as a touch electrode line as an example.

Figure 6:
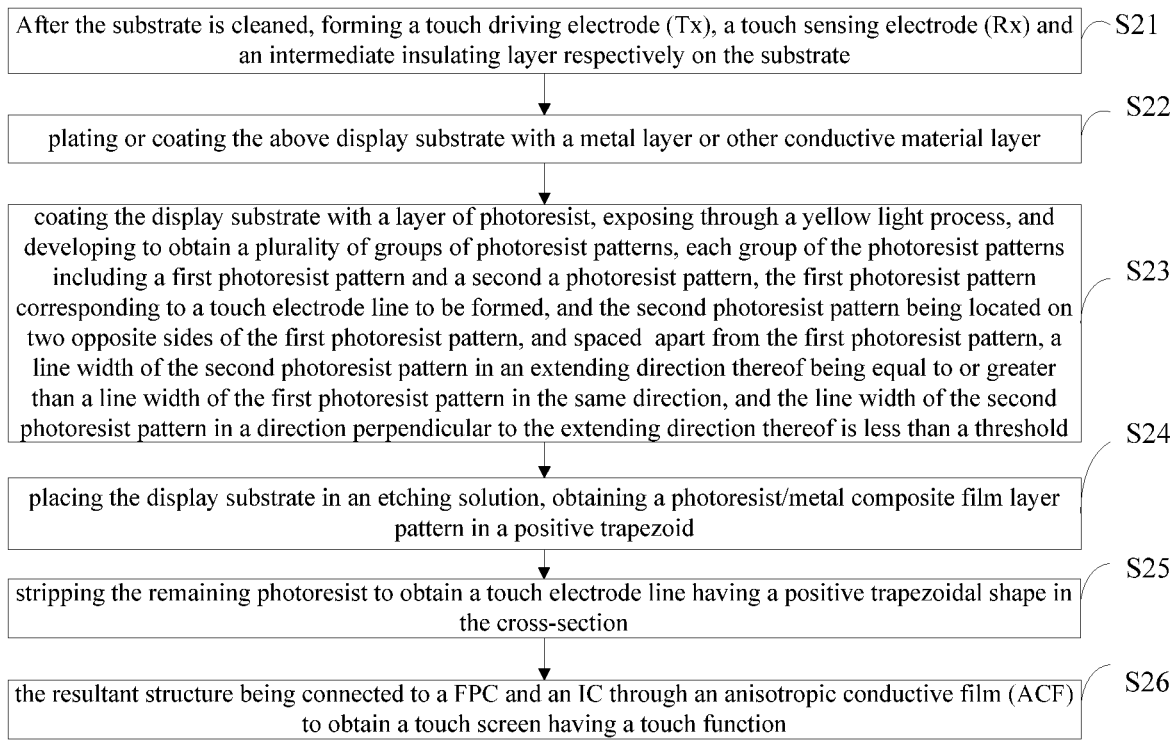
FIG. 6 is a flow chart showing a method for manufacturing a display substrate according to some embodiments of the present disclosure.

As shown in FIG. 6, the method for manufacturing the display substrate includes the following steps.

Step 21: After the substrate is cleaned, forming a touch driving electrode (Tx), a touch sensing electrode (Rx) and an intermediate insulating layer respectively on the substrate;

Step 22: plating or coating the above display substrate with a metal layer or other conductive material layer;

Step 23: coating the display substrate with a layer of photoresist, exposing through a yellow light process, and developing to obtain a plurality of groups of photoresist patterns, each group of the photoresist patterns including a first photoresist pattern and a second a photoresist pattern, the first photoresist pattern corresponding to a touch electrode line to be formed, and the second photoresist pattern being located on two opposite sides of the first photoresist pattern, and spaced apart from the first photoresist pattern, a line width of the second photoresist pattern in an extending direction thereof being equal to or greater than a line width of the first photoresist pattern in the same direction, and the line width of the second photoresist pattern in a direction perpendicular to the extending direction thereof is less than a threshold;

Step 24: placing the display substrate in an etching solution. As the reaction time is extended, the etching process is as shown in (b)-(d) of FIG. 4, and finally a photoresist/metal composite film layer pattern in a positive trapezoid as shown in FIG. 4(e) is obtained;

Step 25: stripping the remaining photoresist to obtain a touch electrode line having a positive trapezoidal shape in the cross-section, as shown in FIG. 4(f); the contract area between the touch electrode line and the substrate are larger than that in the prior art, and it has a larger slope angle with the substrate, and has a larger FICD and has a positive trapezoidal shape than the existing touch electrode line after a wet etching process;

Step 26: the resultant structure being connected to a flexible printed circuit (FPC) and an integrated circuit (IC) through an anisotropic conductive film (ACF) to obtain a touch screen having a touch function.

Through the method for manufacturing the display substrate, the undercut problem of the formed touch electrode line can be avoided, and the yield and performance of the display substrate can be improved, especially for a narrow bezel display product.

Some embodiments of the present disclosure further provide a display substrate, which is manufactured by using the method described in any of the above embodiments, the display substrate includes a substrate, and a film layer pattern disposed on the substrate. The vertical cross section of the film pattern has a shape of a positive trapezoid.

Optionally, the film layer pattern is a metal line in a non-display area.

Optionally, the display substrate is a touch display substrate, and the film layer pattern is a touch electrode line in a non-display area.

Some embodiments of the present disclosure also provide a display device including the above display substrate.

Unless otherwise defined, technical terms or scientific terms used in the present disclosure are intended to be understood in the ordinary meaning of the ordinary skill of the art. The words "first," "second," and similar terms used in the present disclosure do not denote any order, quantity, or importance, but are used to distinguish different components. Similarly, the words "a" or "an" and the like do not denote a quantity limitation, but mean that there is at least one. "Connected" or "coupled" and the like are not limited to physical or mechanical connections, but may include electrical connections, whether direct or indirect. "Upper", "lower", "left", "right", etc. are only used to indicate the relative positional relationship, and when the absolute position of an object to be described is changed, the relative positional relationship is also changed accordingly.

The above is an alternative embodiment of the present disclosure, and it should be noted that those skilled in the art can also make further improvements and modifications without departing from the principles of the present disclosure. It should also be within the scope of protection of the present disclosure.

What is claimed is:

1. A method for manufacturing a display substrate, comprising:
   providing a substrate;
   forming a film layer and a photoresist layer to be patterned on the substrate;
   exposing and developing the photoresist layer by using a mask plate, to form at least one group of photoresist patterns, the mask plate comprises at least one group of mask patterns, each group of mask patterns including a first pattern, corresponding to the film layer pattern; and a second pattern, located on at least two opposite sides of the first pattern; the second pattern and the first pattern being alternately arranged, a line width of the second pattern along an extending direction of the second pattern being equal to a line width of the first pattern along the extending direction of the second pattern, and the line width of the second pattern along a direction perpendicular to extending direction of the second pattern being within a threshold range, each group of photoresist patterns including a first photoresist pattern and a second photoresist pattern, the first photoresist pattern corresponding to a film layer pattern to be formed, and the second photoresist pattern being located on at least two opposite sides of the first photoresist pattern, and spaced apart from the first photoresist pattern, a line width of the second photoresist pattern in the extending direction of the second photoresist pattern being equal to or greater than a line width of the first photoresist pattern in the extending direction of the second photoresist pattern, and a line width of the second photoresist pattern in a direction perpendicular to the extending direction of the second photoresist pattern is within a threshold range; and wet-etching the film layer to be patterned so that a film layer between the first photoresist pattern and the second photoresist pattern is etched, a film layer under the second photoresist pattern being detached from the substrate, and a film layer under the first photoresist pattern forming the film layer pattern.

2. The method according to claim 1, wherein the threshold range is 5%-10% of the line width of the first pattern along the extending direction of the second pattern.

3. The method according to claim 1, wherein spacing between the first pattern and the second pattern is 5%-10% of the line width of the first pattern along a direction perpendicular to the extending direction of the second pattern.

4. The method according to claim 1, wherein the film layer is made of a metal or a metal oxide.

5. The method according to claim 4, wherein the film layer pattern is metal lines.

6. The method according to claim 5, wherein the film layer pattern is metal lines in a non-display area.

7. The method according to claim 6, wherein the display substrate is a touch display substrate and the film layer pattern is touch electrode lines in the non-display area.

8. The method according to claim 1, wherein the first pattern and the second pattern are both light transmitting patterns, or both opaque patterns.

9. The method according to claim 1, wherein the second pattern has a rectangle or long elliptical shape.

10. A display substrate, manufactured by using the method according to claim 1, wherein the display substrate comprises:
    a substrate, and
    a film layer pattern disposed on the substrate, a vertical cross section of the film layer pattern having a positive trapezoid shape.

11. The display substrate according to claim 10, wherein the film layer pattern is metal lines in a non-display area.

12. The display substrate according to claim 10, wherein the display substrate is a touch display substrate and the film layer pattern is touch electrode lines in a non-display area.

13. A display device, comprising the display substrate according to claim 10.

* * * * *